United States Patent
He et al.

(10) Patent No.: US 11,537,165 B2
(45) Date of Patent: Dec. 27, 2022

(54) DISPLAY SUBSTRATE, METHOD FOR MANUFACTURING THE SAME, AND DISPLAY PANEL

(71) Applicants: MIANYANG BOE OPTOELECTRONICS TECHNOLOGY CO., LTD., Mianyang (CN); BOE TECHNOLOGY GROUP CO., LTD., Beijing (CN)

(72) Inventors: Haizhou He, Beijing (CN); Ming Shi, Beijing (CN); Guoren Hu, Beijing (CN); Wen Sun, Beijing (CN); Zhangrui Zhao, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 247 days.

(21) Appl. No.: 16/935,147

(22) Filed: Jul. 21, 2020

(65) Prior Publication Data
US 2021/0072797 A1 Mar. 11, 2021

(30) Foreign Application Priority Data
Sep. 10, 2019 (CN) .......................... 201910852937.4

(51) Int. Cl.
*G06F 1/16* (2006.01)
*G06F 1/18* (2006.01)
(Continued)

(52) U.S. Cl.
CPC ............ *G06F 1/1652* (2013.01); *G06F 1/189* (2013.01); *G09F 9/301* (2013.01); *H01L 51/0097* (2013.01); *H05K 1/028* (2013.01)

(58) Field of Classification Search
None
See application file for complete search history.

(56) References Cited

U.S. PATENT DOCUMENTS 9,349,758 B2 5/2016 Ki et al.
10,361,385 B2 7/2019 Choi et al.
(Continued)

FOREIGN PATENT DOCUMENTS

CN 106716642 A 5/2017
CN 107086236 A 8/2017
(Continued)

OTHER PUBLICATIONS

First Chinese Office Action dated May 8, 2021, received for corresponding Chinese Application No. 201910852937.4, 23 pages.

*Primary Examiner* — J. E. Schoenholtz
(74) *Attorney, Agent, or Firm* — Kinney & Lange, P.A.

(57) ABSTRACT

Embodiments of the present disclosure propose a display substrate, a method for manufacturing the same, and a display panel. In an embodiment, the display substrate includes a flexible substrate, the flexible substrate includes a bending region, the bending region has a first groove, wherein at least an inner wall of the first groove has a first flexible layer, at least one rib is provided on the first flexible layer at a bottom of the first groove, a wiring layer covers the rib on the first flexible layer, and the wiring layer has alternating protrusions and recessions, and an orthographic projection of the protrusions on the flexible substrate and an orthographic projection of the rib on the flexible substrate at least partially overlap.

18 Claims, 3 Drawing Sheets

(51) Int. Cl.
    *G09F 9/30*    (2006.01)
    *H01L 51/00*   (2006.01)
    *H05K 1/02*    (2006.01)

(56) References Cited

U.S. PATENT DOCUMENTS

| 2014/0097408 | A1* | 4/2014  | Kim   | H01L 27/3237 |
|              |     |         |       | 257/40       |
| 2018/0331166 | A1* | 11/2018 | Cho   | H01L 27/3265 |
| 2020/0341516 | A1* | 10/2020 | Huang | G06F 1/1637  |
| 2021/0074731 | A1  | 3/2021  | Cheng |              |

FOREIGN PATENT DOCUMENTS

| CN | 108022942 A | 5/2018 |
| CN | 108091679 A | 5/2018 |
| CN | 109273503 A | 1/2019 |

* cited by examiner

DISPLAY SUBSTRATE, METHOD FOR MANUFACTURING THE SAME, AND DISPLAY PANEL

CROSS-REFERENCE TO RELATED APPLICATION

This application claims priority of Chinese Patent Application No. 201910852937.4 filed on Sep. 10, 2019 in China National Intellectual Property Administration, the disclosure of which is incorporated herein by reference in entirety.

TECHNICAL FIELD

Embodiments of the present disclosure generally relate to the field of display technology, and in particular, to a display substrate, a method for manufacturing the same, and a display panel.

BACKGROUND

With the increasing demand of users for miniaturization and portability of electronic products, traditional display devices have been unable to meet this demand. In order to solve this problem, flexible display products have appeared in recent years. However, the existing flexible display product has the problem that the bending region thereof cannot meet actual needs, that is, there is a risk of breakage in the wirings of the bending region after multiple bending operations.

SUMMARY

In an aspect, embodiments of the present disclosure provides a display substrate, comprising a flexible substrate, the flexible substrate comprising a bending region, the bending region having a first groove, wherein at least an inner wall of the first groove has a first flexible layer, at least one rib is provided on the first flexible layer at a bottom of the first groove, a wiring layer covers the rib on the first flexible layer, and the wiring layer has alternating protrusions and recessions, and an orthographic projection of the protrusions on the flexible substrate and an orthographic projection of the rib on the flexible substrate at least partially overlap.

In some exemplary embodiments, an included angle between a side wall and the bottom of the first groove is less than about 50°.

In some exemplary embodiments, a planarization layer is provided on the wiring layer, at least one second groove is provided in the planarization layer at a side of the planarization layer away from the flexible substrate, and an orthographic projection of the second groove on the flexible substrate and the orthographic projection of the rib on the flexible substrate at least partially overlap.

In some exemplary embodiments, the first flexible layer has a third groove in the first groove, and the wiring layer has a fourth groove in the third groove, and the planarization layer has the second groove in the fourth groove.

In some exemplary embodiments, the first flexible layer is made from a second polyimide photoresist.

In some exemplary embodiments, the wiring layer is made from one or more of platinum, ruthenium, gold, silver, molybdenum, chromium, aluminum, tantalum, titanium, or tungsten; and the wiring layer has a single-layer, double-layer or multi-layer structure.

In some exemplary embodiments, the rib and the first flexible layer are integrally formed from a same material.

In some exemplary embodiments, the rib and the first flexible layer are formed separately from different materials, and the rib is made from SiNx and/or SiOx.

In some exemplary embodiments, in the first groove, the first flexible layer is made from a second polyimide photoresist; the wiring layer is made from one or more of platinum, ruthenium, gold, silver, molybdenum, chromium, aluminum, tantalum, titanium, or tungsten; and the planarization layer is made from PI.

In another aspect, embodiments of the present disclosure provides a method for manufacturing a display substrate, comprising:

providing a flexible substrate, the flexible substrate comprising a bending region;

forming a first groove in the bending region;

forming a first flexible layer on at least an inner wall of the first groove;

forming at least one rib on the first flexible layer at a bottom of the first groove; and forming a wiring layer that covers the rib on the first flexible layer, so that the wiring layer is formed with alternating protrusions and recessions, and an orthographic projection of the protrusions on the flexible substrate and an orthographic projection of the rib on the flexible substrate at least partially overlap.

In some exemplary embodiments, the method further comprises:

forming a planarization layer having at least one second groove on the wiring layer, wherein the second groove is formed in the planarization layer at a side of the planarization layer away from the flexible substrate, and an orthographic projection of the second groove on the flexible substrate and the orthographic projection of the rib on the flexible substrate at least partially overlap.

In some exemplary embodiments, steps of forming a first groove in the bending region, forming a first flexible layer on at least an inner wall of the first groove, and forming at least one rib on the first flexible layer at a bottom of the first groove, further comprise:

forming a buffer layer, a first insulating layer, a second insulating layer and an interlayer insulating layer in sequence on the flexible substrate;

forming the first groove in the bending region, the first groove exposing the flexible substrate; and coating a second polyimide photoresist so that the second polyimide photoresist covers the interlayer insulating layer and the flexible substrate exposed by the first groove, exposing and developing the second polyimide photoresist to form the first flexible layer with a third groove in the first groove, the at least one rib being formed on the first flexible layer at the bottom of the first groove.

In some exemplary embodiments, the method further comprises:

coating a first polyimide photoresist on the wiring layer, exposing and developing the first polyimide photoresist to form a planarization layer having at least one second groove, wherein the second groove is formed in the planarization layer at a side of the planarization layer away from the flexible substrate.

In some exemplary embodiments, the forming a wiring layer that covers the rib on the first flexible layer, so that the wiring layer is formed with alternating protrusions and recessions, and an orthographic projection of the protrusions on the flexible substrate and an orthographic projection of the rib on the flexible substrate at least partially overlap, further comprises:

depositing the wiring layer, the wiring layer covering the first flexible layer, and a fourth groove being formed on the wiring layer in the third groove; and etching the wiring layer between adjacent ribs by a part of a thickness of the wiring layer through a patterning process, so that the wiring layer is formed with alternating protrusions and recessions, and an orthographic projection of the protrusions on the flexible substrate and an orthographic projection of the rib on the flexible substrate at least partially overlap.

In some exemplary embodiments, steps of forming a first groove in the bending region, forming a first flexible layer on at least an inner wall of the first groove, and forming at least one rib on the first flexible layer at a bottom of the first groove, further comprise:

forming a buffer layer, a first insulating layer, a second insulating layer and an interlayer insulating layer in sequence on the flexible substrate;

forming the first groove in the bending region, the first groove exposing the flexible substrate;

coating a second polyimide photoresist so that the second polyimide photoresist covers the interlayer insulating layer and the flexible substrate exposed by the first groove, exposing and developing the second polyimide photoresist to form the first flexible layer with a third groove in the first groove; and forming an inorganic material layer on the first flexible layer through a patterning process, the inorganic material layer comprising the at least one rib.

In some exemplary embodiments, the step of forming a wiring layer that covers the rib on the first flexible layer, so that the wiring layer is formed with alternating protrusions and recessions, and an orthographic projection of the protrusions on the flexible substrate and an orthographic projection of the rib on the flexible substrate at least partially overlap, further comprises:

depositing the wiring layer, the wiring layer covering the interlayer insulating layer and the first flexible layer, and a fourth groove being formed on the wiring layer in the third groove; and etching the wiring layer between adjacent ribs by a part of a thickness of the wiring layer through a patterning process, so that the wiring layer is formed with alternating protrusions and recessions, and an orthographic projection of the protrusions on the flexible substrate and an orthographic projection of the rib on the flexible substrate at least partially overlap.

In another aspect, embodiments of the present disclosure provides a display panel, comprising the display substrate according to any one of the abovementioned embodiments.

In some exemplary embodiments, an included angle between a side wall and the bottom of the first groove is less than about 50°.

In some exemplary embodiments, a planarization layer is provided on the wiring layer, at least one second groove is provided in the planarization layer at a side of the planarization layer away from the flexible substrate, and an orthographic projection of the second groove on the flexible substrate and the orthographic projection of the rib on the flexible substrate at least partially overlap.

In some exemplary embodiments, the first flexible layer has a third groove in the first groove, and the wiring layer has a fourth groove in the third groove, and the planarization layer has the second groove in the fourth groove.

BRIEF DESCRIPTION OF THE DRAWINGS

By reading the detailed description of the non-limiting embodiments made with reference to the following drawings, other features, objects, and advantages of the present disclosure will become more obvious.

DETAILED DESCRIPTION OF EMBODIMENTS

The present disclosure will be further described in detail below with reference to the drawings and the embodiments. It should be appreciated that the specific embodiments described herein are only intended to explain examples of the related invention, and not to limit the present disclosure. It should also be noted that, for ease of description, only the parts related to the present disclosure are shown in the drawings.

It should be noted that the embodiments and the features in the embodiments of the present disclosure may be combined with each other without conflict. The present disclosure will be described in detail below with reference to the drawings and the embodiments.

As shown in FIGS. 1-8, the display substrate according to an embodiment of the present disclosure includes a flexible substrate 1, the flexible substrate 1 includes a bending region, the bending region has a first groove 6, at least an inner wall of the first groove 6 has a first flexible layer 7, at least one rib 8 is provided on the first flexible layer 7 at the bottom of the first groove 6, a wiring layer 10 covers the rib 8 on the first flexible layer 7, the wiring layer 10 has alternating protrusions 11 and recessions 12, an orthographic projection of the protrusions 11 on the flexible substrate 1 and an orthographic projection of the rib 8 on the flexible substrate 1 at least partially overlap.

Figure 1:
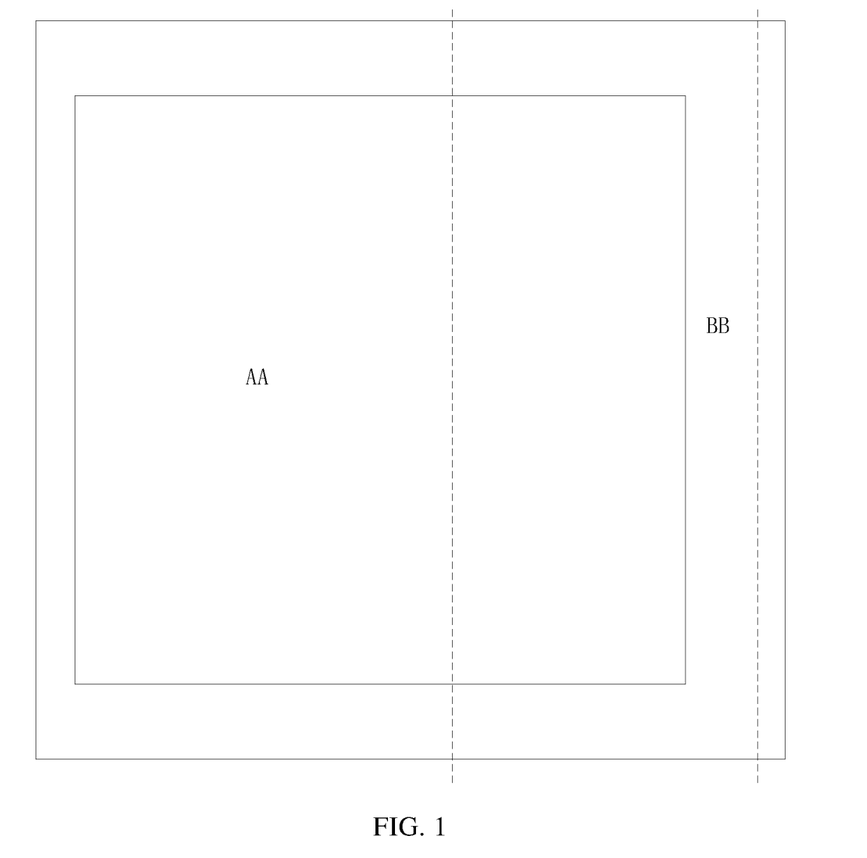
FIG. 1 is a schematic top view of a display substrate according to an embodiment of the present disclosure.

It should be noted that the bending region may be located in the non-display area BB or the display area AA. The region marked by dotted lines in FIG. 1 is a bending region, the bending region is shown only as an example, and it does not limit the specific position and the bending direction of the bending region.

According to the embodiment of the present disclosure, the rib 8 and the first flexible layer 7 may be formed integrally from the same material, or may be formed separately from different materials. Hereinafter, the integral formation and the separate formation of the rib 8 and the first flexible layer 7 will be described in detail.

According to the embodiment of the present disclosure, the wiring layer 10 in the bending region forms a shape of alternating protrusions 11 and recessions 12, and the concave-convex wiring structure has a longer total length in the same area than the planar wiring structure. When bending, the concave-convex bending region can produce a large amount of extension, and the extension of the concave-convex bending region can reduce the stress during bending, which is helpful to reduce the risk of breaking of the wiring layer 10 and improve the reliability of the bending region.

Further, a planarization layer 13 is provided on the wiring layer 10, and at least one second groove 15 is provided in the planarization layer 13 at a side of the planarization layer away from the flexible substrate 1, and an orthographic projection of the second groove 15 on the flexible substrate 1 and the orthographic projection of the ribs 8 on the flexible substrate 1 at least partially overlap. By providing the second groove 15 in the region where the ribs 8 are formed, the overall thickness of the bending region is reduced, and consequently the stress in the bending region during bending is reduced, and the reliability of the bending region is further improved. The planarization layer 13 may use a PI material or a planarization (PLN) material, and the PI material is taken as an example for description below.

As an implementation mode, the included angle α between the side wall and the bottom surface of the first groove 6 is less than about 50°, so as to reduce the steepness of the side wall. In this way, on the one hand, it prevents the wiring layer 10 from short-circuiting when forming the wiring layer 10, and on the other hand, it prevents photoresist from remaining at the opening of the first groove 6 to prevent the wiring layer 10 from short-circuiting.

Further, the first flexible layer 7 has a third groove 9 in the first groove 6, the wiring layer 10 has a fourth groove 14 in the third groove 9, and the planarization layer 13 the second groove 15 in the fourth groove 14. The above-mentioned structure also forms a multi-layer groove-like structure in the bending region, so as to reduce the overall thickness of the bending region to the greatest extent, so that the stress in the bending region during bending may be reduced.

The technical solutions of the present disclosure will be described in detail below with reference to specific implementations.

The "patterning process" referred to in this specification includes processes such as depositing a film layer, coating a photoresist, exposure by a mask, developing, etching, stripping a photoresist, etc., which are existing mature preparation processes. The deposition may use known processes such as sputtering, evaporation, chemical vapor deposition, the coating may use known coating processes, and the etching may use known methods, they are not specifically limited herein.

The technical solution of the present disclosure will be described in detail below with reference to the manufacturing process of the display substrate. The overall process for manufacturing a display substrate according to the present disclosure is to first form a flexible substrate 1 on a base substrate, and then form various flexible layers, insulating layers, and other structural layers on the flexible substrate 1. After the display substrate is manufactured, the flexible substrate 1 is stripped off from the base substrate. Herein, the base substrate may use a material such as glass or silicon, and the flexible substrate 1 may use a polyimide (PI) material.

Figure 2:
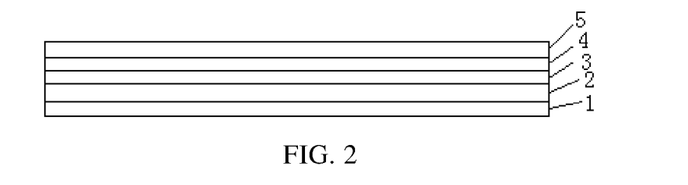
FIGS. 2-8 are respectively structural schematic views showing a manufacturing process of a display substrate according to an embodiment of the present disclosure.

First, a buffer layer 2, a first insulating layer 3, a second insulating layer 4, and an interlayer insulating layer 5 are sequentially formed on the flexible substrate 1, as shown in FIG. 2.

The buffer layer 2, the first insulating layer 3, the second insulating layer 4, and the interlayer insulating layer 5 may be sequentially formed on the flexible substrate 1 by using deposition processes.

For example, the buffer layer 2, the first insulating layer 3, the second insulating layer 4 and the interlayer insulating layer 5 may be made from a silicon oxide SiOx, silicon nitride SiNx or silicon oxynitride Si(ON)x material, and they may be of a single-layer, double-layer or multi-layer structure, for example, SiNx/SiOx composite films. In this way, it may play a better role in blocking and planarization, and at the same time, it is also beneficial to stress relief between the films.

Figure 3:
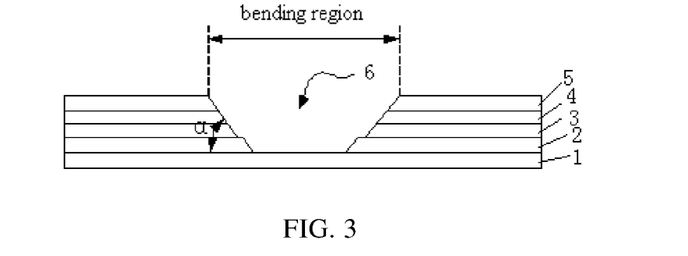

Second, the first groove 6 is formed in the bending region.

A photoresist is coated on the interlayer insulating layer 5, the photoresist is exposed and developed by a single-tone mask, to form a fully exposed region in the bending region, the photoresist is removed to expose the interlayer insulating layer 5, the remaining position form an unexposed region, the photoresist is retained there, the fully exposed region is etched and the remaining photoresist is stripped to form the pattern of the first groove 6, as shown in FIG. 3. During the etching, the buffer layer 2, the first insulating layer 3, the second insulating layer 4 and the interlayer insulating layer 5 in the bending region are etched away to form the first groove 6 exposing the flexible substrate 1. After this process, there is no structural layer on the flexible substrate 1 in the bending region.

Figure 4:
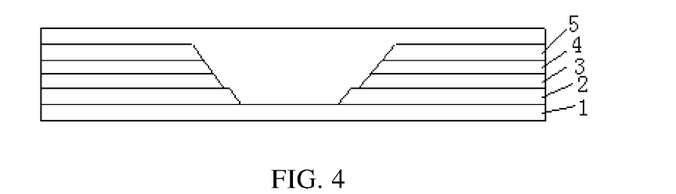

Third, the first flexible layer 7 is formed.

Figure 5:
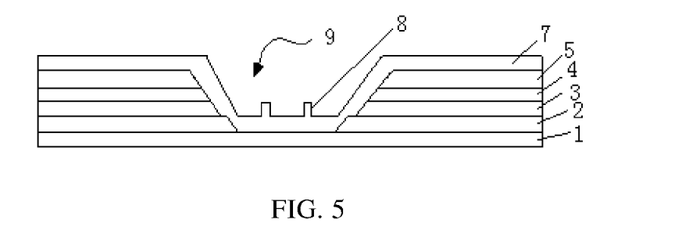

A second polyimide photoresist is coated, as shown in FIG. 4. The second polyimide photoresist covers the interlayer insulating layer 5 and the flexible substrate 1 exposed by the first groove 6, the second polyimide photoresist is exposed and developed by using a half-tone mask, to form a partially exposed region in the bending region, the second polyimide photoresist is partially removed to form a pattern of the third groove 9, and there is at least one rib 8 at the bottom of the third groove 9, the second polyimide photoresist is exposed and developed by using a half-tone mask to form at least one rib 8 integrated with the first flexible layer 7. In this embodiment, two ribs 8 are used, as shown in FIG. 5.

Figure 6:
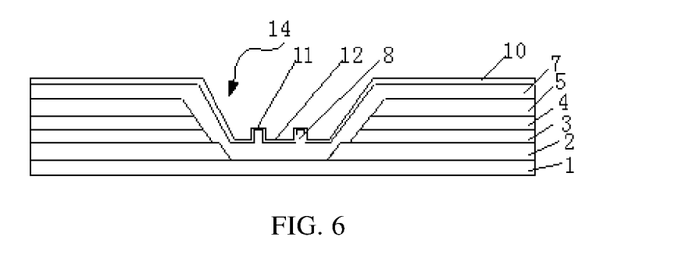

Fourth, the wiring layer 10 is formed.

The wiring layer 10 is formed on the first flexible layer 7 by a deposition process, the wiring layer 10 covers the first flexible layer 7, and the wiring layer 10 has a fourth groove 14 in the third groove 9. The wiring layer 10 between adjacent ribs 8 is etched away by a part of a thickness of the wiring layer through a patterning process, so that the wiring layer 10 is formed with alternating protrusions 11 and recessions 12, and an orthographic projection of the protrusions 11 on the flexible substrate 1 and an orthographic projection of the ribs 8 on the flexible substrate 1 at least partially overlap, as shown in FIG. 6. The wiring layer 10 may be made from one or more of platinum Pt, ruthenium Ru, gold Au, silver Ag, molybdenum Mo, chromium Cr, aluminum Al, tantalum Ta, titanium Ti, tungsten W and other metals, and may be of a single-layer, double-layer or multi-layer structure. In an exemplary embodiment, it has a three-layer structure of Ti/Al/Ti.

Figure 7:
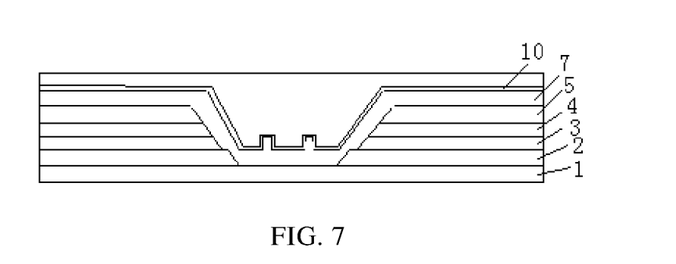

Fifth, the planarization layer 13 is formed.

Figure 8:
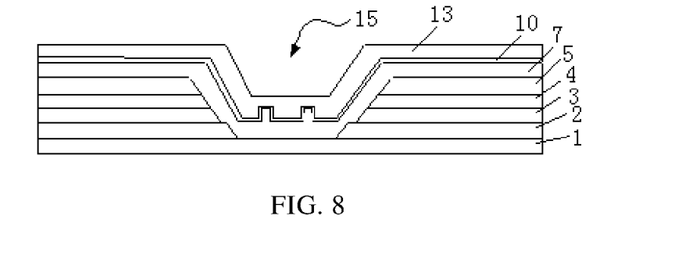

A first polyimide photoresist is coated on the wiring layer 10, as shown in FIG. 7. The first polyimide photoresist is exposed and developed by using a single-tone mask, to form a partially exposed region in the bending region, the first polyimide photoresist is partially removed, the planarization layer 13 having at least one second groove 15 is formed, the second groove 15 is formed at the side of the planarization layer 13 away from the flexible substrate 1, and an orthographic projection of the second groove 15 on the flexible substrate 1 and the orthographic projection of the ribs 8 on the flexible substrate 1 at least partially overlaps, as shown in FIG. 8.

In actual implementation, the number of the ribs 8 and the number of the second grooves 15 may be set according to actual needs.

In addition to the above manufacturing process, other manufacturing processes may also be used. In another manufacturing process, it is mainly different from the above manufacturing process in the third step, and the remaining steps may be the same.

Figure 9:
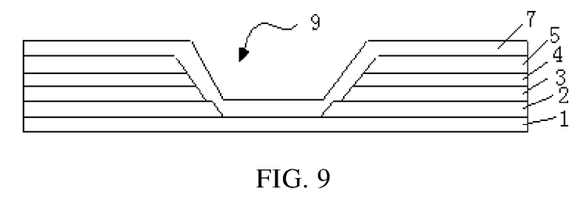
FIGS. 9-10a are respectively schematic structural views showing a manufacturing process of a display substrate according to another embodiment of the present disclosure.
Figure 10:
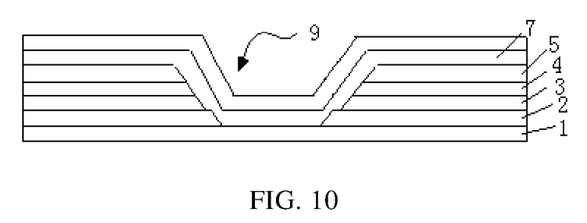
Figure 10A:
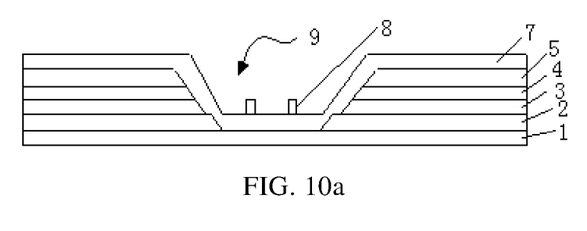

In the third step of the manufacturing process, the second polyimide photoresist is coated, the second polyimide photoresist covers the interlayer insulating layer 5 and the flexible substrate 1 exposed by the first groove 6, the second polyimide photoresist is exposed and developed by using a single-tone mask, to form a partially exposed region in the bending region, the second polyimide photoresist is partially removed to form the pattern of the third groove 9, after this process, the surface of the formed first flexible layer 7 at the bottom of the third groove 9 is planar, as shown in FIG. 9. Then an inorganic material film is deposited on the first flexible layer 7, a photoresist is coated on the inorganic material film, the photoresist is exposed and developed by using a single-tone mask, to form a fully exposed region in the bending region, the photoresist is removed, the inorganic material film is exposed at the position where the ribs 8 are formed, and the unexposed region is formed at the remaining position, the photoresist is retained, the fully exposed region is etched and the remaining photoresist is stripped, to form the pattern of the ribs 8, as shown in FIG. 10 and FIG. 10*a*. The ribs 8 and the first flexible layer 7 formed in this step are separate structures of different materials. The inorganic material film may be made from a silicon oxide SiOx, silicon nitride SiNx or silicon oxynitride Si(ON)x material, and may be of a single-layer, double-layer or multi-layer structure, for example, SiNx/SiOx composite films.

Figure 11:
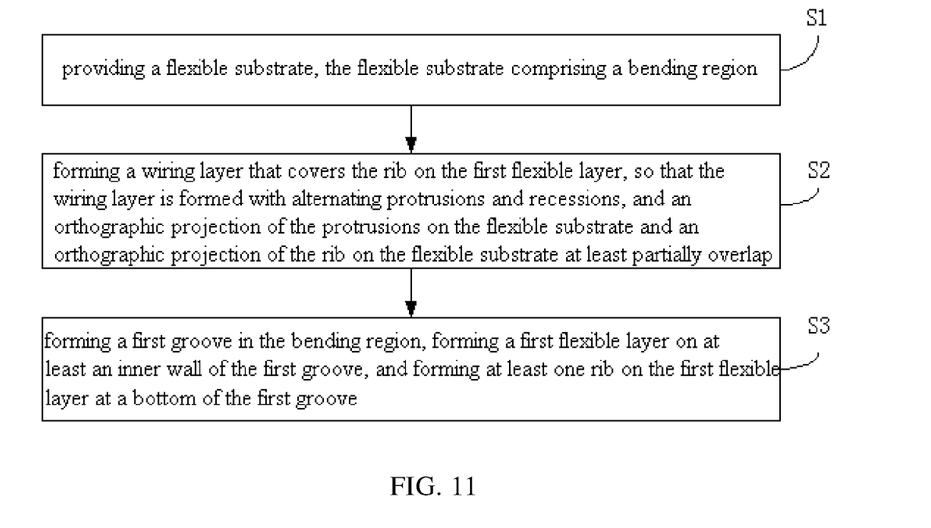
FIG. 11 is a flowchart of a method for manufacturing a display substrate according to an embodiment of the present disclosure.

As shown in FIG. 11, the present disclosure also provides a method for manufacturing a display substrate, including:

S1: providing a flexible substrate 1, the flexible substrate 1 including a bending region;

S2: forming a first groove 6 in the bending region, forming a first flexible layer 7 on at least an inner wall of the first groove 6, and forming at least one rib 8 on the first flexible layer 7 at a bottom of the first groove 6;

S3: forming a wiring layer 10 that covers the rib 8 on the first flexible layer 7, so that the wiring layer 10 is formed with alternating protrusions 11 and recessions 12, and an orthographic projection of the protrusions 11 on the flexible substrate 1 and an orthographic projection of the rib 8 on the flexible substrate 1 at least partially overlap.

Further, after S3, it also includes:

S4: coating a first polyimide photoresist on the wiring layer 10, exposing and developing the first polyimide photoresist to form a planarization layer 13 having at least one second groove 15, wherein the second groove 15 is formed in the planarization layer 13 at a side of the planarization layer away from the flexible substrate 1, the orthographic projection of the second groove 15 on the flexible substrate 1 and the orthographic projection of the rib 8 on the flexible substrate 1 at least partially overlap.

Further, S2 specifically includes:

S211: forming a buffer layer 2, a first insulating layer 3, a second insulating layer 4 and an interlayer insulating layer 5 in sequence on the flexible substrate 1;

S212: forming the first groove 6 in the bending region, the first groove 6 exposing the flexible substrate 1;

S213: coating a second polyimide photoresist so that the second polyimide photoresist covers the interlayer insulating layer 5 and the flexible substrate 1 exposed by the first groove 6, exposing and developing the second polyimide photoresist to form the first flexible layer 7 with a third groove 9 in the first groove 6, the at least one rib 8 being formed on the first flexible layer 7 at the bottom of the first groove 6.

As another implementation mode, S2 specifically includes:

S221: forming a buffer layer 2, a first insulating layer 3, a second insulating layer 4 and an interlayer insulating layer 5 in sequence on the flexible substrate 1;

S222: forming the first groove 6 in the bending region, the first groove 6 exposing the flexible substrate 1;

S223: coating a second polyimide photoresist so that the second polyimide photoresist covers the interlayer insulating layer 5 and the flexible substrate 1 exposed by the first groove 6, exposing and developing the second polyimide photoresist to form the first flexible layer 7 with a third groove 9 in the first groove 6;

S224: forming an inorganic material layer on the first flexible layer 7 through a patterning process, the inorganic material layer comprising the at least one rib 8.

Further, S3 specifically includes:

S31: depositing the wiring layer 10, the wiring layer 10 covering the interlayer insulating layer 5 and the first flexible layer 1, and a fourth groove 14 being formed on the wiring layer 10 in the third groove 9;

S32: etching the wiring layer 10 between adjacent ribs 8 by a part of a thickness of the wiring layer through a patterning process, so that the wiring layer 10 is formed with alternating protrusions 11 and recessions 12 at a position where the wiring layer covers the ribs 8, and an orthographic projection of the protrusions 11 on the flexible substrate 1 and an orthographic projection of the rib 8 on the flexible substrate 1 at least partially overlap.

The present disclosure also provides a display panel including the display substrate described according to any one of the above embodiments. The display panel may be applied to a mobile phone, a tablet computer, etc.

The above description only refers to exemplary embodiments of the present disclosure and a description of the applied technical principles. It should be understood by those skilled in the art that the scope of the present disclosure is not limited to the technical solutions formed by some specific combinations of the above technical features, but should cover all other technical solutions formed by any combinations of the above technical features or their equivalent features without departing from the inventive concept of the present disclosure, for example, the technical solutions formed by the replacement of the above features with similar functions in the present disclosure.

What is claimed is:

1. A display substrate, comprising a flexible substrate, the flexible substrate comprising a bending region, the bending region having a first groove, wherein at least an inner wall of the first groove has a first flexible layer, at least one rib is provided on the first flexible layer at a bottom of the first groove, a wiring layer covers the rib on the first flexible layer, and the wiring layer has alternating protrusions and recessions, and an orthographic projection of the protrusions on the flexible substrate and an orthographic projection of the rib on the flexible substrate at least partially overlap; and wherein a planarization layer is provided on the wiring layer, at least one second groove is provided in the planarization layer at a side of the planarization layer away from the flexible substrate, and an orthographic projection of the second groove on the flexible substrate and the orthographic projection of the rib on the flexible substrate at least partially overlap.

2. The display substrate according to claim 1, wherein an included angle between a side wall and the bottom of the first groove is less than about 50°.

3. The display substrate according to claim 1, wherein the first flexible layer has a third groove in the first groove, the wiring layer has a fourth groove in the third groove, and the planarization layer has the second groove in the fourth groove.

4. The display substrate according to claim 1, wherein the first flexible layer is made from a second polyimide photoresist.

5. The display substrate according to claim 1, wherein:
the wiring layer is made from one or more of platinum, ruthenium, gold, silver, molybdenum, chromium, aluminum, tantalum, titanium, or tungsten; and
the wiring layer has a single-layer, double-layer or multi-layer structure.

6. The display substrate according to claim 1, wherein the rib and the first flexible layer are integrally formed from a same material.

7. The display substrate according to claim 1, wherein:
the rib and the first flexible layer are formed separately from different materials, and
the rib is made from SiNx and/or SiOx.

8. The display substrate according to claim 1, wherein, in the first groove,
the first flexible layer is made from a second polyimide photoresist;
the wiring layer is made from one or more of platinum, ruthenium, gold, silver, molybdenum, chromium, aluminum, tantalum, titanium, or tungsten; and
the planarization layer is made from polyimide (PI).

9. A method for manufacturing a display substrate, comprising:
providing a flexible substrate, the flexible substrate comprising a bending region;
forming a first groove in the bending region;
forming a first flexible layer on at least an inner wall of the first groove;
forming at least one rib on the first flexible layer at a bottom of the first groove;
forming a wiring layer that covers the rib on the first flexible layer, so that the wiring layer is formed with alternating protrusions and recessions, and an orthographic projection of the protrusions on the flexible substrate and an orthographic projection of the rib on the flexible substrate at least partially overlap; and
forming a planarization layer having at least one second groove on the wiring layer,
wherein the second groove is formed in the planarization layer at a side of the planarization layer away from the flexible substrate, and an orthographic projection of the second groove on the flexible substrate and the orthographic projection of the rib on the flexible substrate at least partially overlap.

10. The method according to claim 9, wherein the steps of forming a first groove in the bending region, forming a first flexible layer on at least an inner wall of the first groove, and forming at least one rib on the first flexible layer at a bottom of the first groove, further comprise:
forming a buffer layer, a first insulating layer, a second insulating layer and an interlayer insulating layer in sequence on the flexible substrate;
forming the first groove in the bending region, the first groove exposing the flexible substrate; and
coating a second polyimide photoresist so that the second polyimide photoresist covers the interlayer insulating layer and the flexible substrate exposed by the first groove, exposing and developing the second polyimide photoresist to form the first flexible layer with a third groove in the first groove, the at least one rib being formed on the first flexible layer at the bottom of the first groove.

11. The method according to claim 10, further comprising:
coating a first polyimide photoresist on the wiring layer, exposing and developing the first polyimide photoresist to form a planarization layer having at least one second groove,
wherein the second groove is formed in the planarization layer at a side of the planarization layer away from the flexible substrate.

12. The method according to claim 11, wherein the step of forming a wiring layer that covers the rib on the first flexible layer, so that the wiring layer is formed with alternating protrusions and recessions, and an orthographic projection of the protrusions on the flexible substrate and an orthographic projection of the rib on the flexible substrate at least partially overlap, further comprises:
depositing the wiring layer, the wiring layer covering the first flexible layer, and a fourth groove being formed on the wiring layer in the third groove; and
etching the wiring layer between adjacent ribs by a part of a thickness of the wiring layer through a patterning process, so that the wiring layer is formed with alternating protrusions and recessions, and the orthographic projection of the protrusions on the flexible substrate and the orthographic projection of the rib on the flexible substrate at least partially overlap.

13. The method according to claim 9, wherein the steps of forming a first groove in the bending region, forming a first flexible layer on at least an inner wall of the first groove, and forming at least one rib on the first flexible layer at a bottom of the first groove, further comprise:
forming a buffer layer, a first insulating layer, a second insulating layer and an interlayer insulating layer in sequence on the flexible substrate;
forming the first groove in the bending region, the first groove exposing the flexible substrate;
coating a second polyimide photoresist so that the second polyimide photoresist covers the interlayer insulating layer and the flexible substrate exposed by the first groove, exposing and developing the second polyimide photoresist to form the first flexible layer with a third groove in the first groove; and
forming an inorganic material layer on the first flexible layer through a patterning process, the inorganic material layer comprising the at least one rib.

14. The method according to claim 13, wherein the step of forming a wiring layer that covers the rib on the first flexible layer, so that the wiring layer is formed with alternating protrusions and recessions, and an orthographic projection of the protrusions on the flexible substrate and an orthographic projection of the rib on the flexible substrate at least partially overlap, further comprises:
depositing the wiring layer, the wiring layer covering the interlayer insulating layer and the first flexible layer, and a fourth groove being formed on the wiring layer in the third groove; and etching the wiring layer between adjacent ribs by a part of a thickness of the wiring layer through a patterning process, so that the wiring layer is formed with alternating protrusions and recessions, and the orthographic projection of the protrusions on the flexible substrate and the orthographic projection of the rib on the flexible substrate at least partially overlap.

15. A display panel, comprising the display substrate according to claim 1.

16. The display panel according to claim 15, wherein an included angle between a side wall and the bottom of the first groove is less than about 50°.

17. The display panel according to claim 15, wherein a planarization layer is provided on the wiring layer, at least one second groove is provided in the planarization layer at a side of the planarization layer away from the flexible substrate, and an orthographic projection of the second groove on the flexible substrate and the orthographic projection of the rib on the flexible substrate at least partially overlap.

18. The display panel according to claim 16, wherein the first flexible layer has a third groove in the first groove, and the wiring layer has a fourth groove in the third groove, and the planarization layer has the second groove in the fourth groove.

\* \* \* \* \*